(12) United States Patent
Lee et al.

(10) Patent No.: US 11,092,884 B2
(45) Date of Patent: Aug. 17, 2021

(54) MASK FOR EXTREME-ULTRAVIOLET (EXTREME-UV) LITHOGRAPHY AND METHOD FOR MANUFACTURING THE SAME

(71) Applicant: IMEC VZW, Leuven (BE)

(72) Inventors: Jae Uk Lee, Heverlee (BE); Ryan Ryoung Han Kim, Bertem (BE)

(73) Assignee: IMEC VZW, Leuven (BE)

( * ) Notice: Subject to any disclaimer, the term of this patent is extended or adjusted under 35 U.S.C. 154(b) by 228 days.

(21) Appl. No.: 16/168,234

(22) Filed: Oct. 23, 2018

(65) Prior Publication Data

US 2019/0155138 A1 May 23, 2019

(30) Foreign Application Priority Data

Nov. 17, 2017 (EP) .................................... 17202392

(51) Int. Cl.
| | |
|---|---|
| *G03F 1/22* | (2012.01) |
| *G03F 1/24* | (2012.01) |
| *G03F 1/48* | (2012.01) |
| *G03F 1/46* | (2012.01) |
| *G03F 1/38* | (2012.01) |
| *G03F 1/32* | (2012.01) |

(52) U.S. Cl.
CPC .................. *G03F 1/22* (2013.01); *G03F 1/24* (2013.01); *G03F 1/32* (2013.01); *G03F 1/38* (2013.01); *G03F 1/46* (2013.01); *G03F 1/48* (2013.01)

(58) Field of Classification Search
None
See application file for complete search history.

(56) References Cited

U.S. PATENT DOCUMENTS

| | | | |
|---|---|---|---|
| 6,607,862 B2 | 8/2003 | Yan et al. | |
| 6,653,053 B2 | 11/2003 | Mangat et al. | |
| 6,986,974 B2 | 1/2006 | Han et al. | |
| 7,972,751 B2 | 7/2011 | Charpin-Nicolle | |
| 8,679,707 B2 | 3/2014 | Lee et al. | |
| 9,548,209 B2 | 1/2017 | Yu et al. | |
| 2009/0233185 A1 | 9/2009 | Oh | |
| 2014/0272678 A1 | 9/2014 | Shih et al. | |
| 2017/0010540 A1* | 1/2017 | Dmitriev | G21K 1/062 |
| 2017/0031241 A1 | 2/2017 | Shen et al. | |

FOREIGN PATENT DOCUMENTS

| | | |
|---|---|---|
| CN | 103163726 A | 6/2013 |
| KR | 10-2016-0094999 A | 8/2016 |
| WO | 2006/033442 A1 | 3/2006 |

OTHER PUBLICATIONS

European Search Report, European Patent Application No. 17202392. 1, dated May 23, 2018, 9 pages.
Jung, H.Y. et al., "Selective Dry Etching of Attenuated Phase-Shift Mask Materials for Extreme Ultraviolet Lithography Using Inductively Coupled Plasmas", J. Vac. Sci. Technol. B 27(6), Nov./Dec. 2009, pp. 2361-2365.
Lee, Sangsul et al., Improved Imaging Properties of Thin Attenuated Phase Shift Masks for Extreme Ultraviolet Lithography, J. Vac. Sci. Technol. B 31(2),Mar./Apr. 2013, pp. 021606-1-021606-5.
Cen, H.L. et al., "High Reflectance of Reflective-Type Attenuated-Phase-Shifting Masks for Extreme Ultraviolet Lithography with High Inspection Contrast in Deep Ultraviolet Regimes", J. Vac. Sci. Technol. B 22(6), Nov./Dec. 2004, pp. 3049-3052.

* cited by examiner

*Primary Examiner* — Kathleen Duda
(74) *Attorney, Agent, or Firm* — McDonnell Boehnen Hulbert & Berghoff LLP

(57) ABSTRACT

Example embodiments relate to masks for extreme-ultraviolet (extreme-UV) lithography and methods for manufacturing the same. An example embodiment includes a mask for extreme-UV lithography. The mask includes a substrate. The mask also includes a reflecting structure that is supported by the substrate in a use face and is reflection-effective for extreme-UV radiation impinging onto the reflecting structure from a side opposite the substrate. Further, the mask includes attenuating and phase-shifting portions that are distributed within the use face that are suitable for attenuating and phase-shifting extreme-UV radiation parts reflected by the mask through the portions such that an upper surface of the mask in the use face, formed partly by the portions on the side opposite the substrate, exhibits height variations at sidewalls of the portions that extend perpendicular to the use face. In addition, the mask includes a capping layer that covers at least the sidewalls of the portions.

16 Claims, 2 Drawing Sheets

MASK FOR EXTREME-ULTRAVIOLET (EXTREME-UV) LITHOGRAPHY AND METHOD FOR MANUFACTURING THE SAME

CROSS-REFERENCE TO RELATED APPLICATIONS

The present application is a non-provisional patent application claiming priority to European Patent Application No. EP 17202392.1, filed Nov. 17, 2017, the contents of which are hereby incorporated by reference.

FIELD OF THE DISCLOSURE

The disclosure relates to a mask for extreme-UV lithography and a method for manufacturing the same

BACKGROUND

Extreme-UV lithography is a promising technology for manufacturing integrated electronic circuits with very high integration level. Indeed, it will allow designing circuits with pattern pitch of much less than 100 nm (nanometer). But the lithography tools which are used up to now for integrated circuit manufacturing cannot be implemented with extreme-UV radiation, since the refracting and beam-forming elements which are effective for visible or UV-radiations are no longer effective for extreme-UV radiations. In the frame of the present description, extreme-UV radiation means electromagnetic radiation with wavelength value from 124 nm down to 10 nm. In particular, because of the radiation sources which are available for extreme-UV, a major wavelength value intended for extreme-UV lithography is 13.5 nm.

For extreme-UV lithography, the masks can no longer be transmission-operating masks, but have to be reflection-operating masks due to the behaviors of materials with respect to extreme-UV radiations. Therefore, a mask for extreme-UV lithography comprises basically a substrate which is provided with a reflecting structure at a use face of the mask, such as a stack of alternated layers of silicon (Si) and molybdenum (Mo), with layer thicknesses that are suitable to produce reflection through interference effect. Commonly, such reflecting structure comprises a total of about forty silicon and molybdenum layer pairs.

A first type of extreme-UV lithography masks are intensity modulation masks, where radiation-absorbing portions are arranged on the reflecting structure of the mask to form the mask pattern. Further, such portions may be thick enough for producing sufficient absorption, e.g., about 70 nm thick along a direction perpendicular to the use face. Since the extreme-UV radiation will impinge obliquely onto the use face, for example with an incidence angle of about 6° (degree), each radiation-absorbing portion produces a shadowed area on a side of this portion opposite the impinging radiation. Such shadowing effect is detrimental for lowering the lithography pitch down to very small values, so that phase shift masks are intended to be used instead of intensity modulation masks.

Two types of phase shift masks have been developed. For one type, the reflecting structure comprised of the stack of alternated layers is arranged at two height levels at the use face, so that the height difference produces the phase shift. Such phase shift masks are called alternating phase shift masks.

But for another type of phase shift masks, portions which are primarily efficient for phase-shifting the reflected extreme-UV radiation are arranged on the reflecting structure of the mask to form the mask pattern. Propagation of the extreme-UV radiation through these portions produces a propagation delay when compared to propagation out of the portions. But actually, best results for lithography quality are obtained when using phase-shifting portions which are also partly radiation-absorbing. Such portions are called attenuating and phase shifting portions, and the phase shift masks of such another type are called attenuated phase shift masks. They are considered to be most promising. In particular, document U.S. Pat. No. 6,986,974 and the article entitled "Improved imaging properties of thin attenuated phase shift masks for extreme ultraviolet lithography", by Sangsul Lee et al., J. Vac. Sci Technol. B31(2), March/April 2013, 021606-1, disclose such attenuated phase shift masks and report about lithography features obtained. In some embodiments, the height difference due to the portions that form the mask pattern is less for an attenuated phase shift mask compared to an intensity modulation mask. So the shadowing effect is reduced as a consequence.

The present disclosure relates to attenuated phase shift masks.

However, an attenuated phase shift mask exhibits asymmetry in the reflected radiation intensity between both sides of one attenuating and phase-shifting portion. Indeed, due to the 6°-oblique incidence of the extreme-UV rays onto the use face of the mask, a second reflection occurs on one of the sidewalls of the attenuating and phase-shifting portion, but not on the opposite sidewall. Indeed, for that one of the portion sidewalls which is exposed to the impinging radiation, the radiation is first reflected by the reflecting structure out of the attenuating and phase-shifting portion, but then a part of the so-reflected radiation is further reflected by the sidewall of the portion which is perpendicular to the use face of the mask. These reflections also occur in the reverse order: first reflection on the portion sidewall and second reflection on the reflecting structure. Such two-reflection scheme does not occur on the other side of the attenuating and phase-shifting portion, which produces limited shadowing effect. Because of this asymmetrical effect, an attenuated phase shift mask exhibits reflection peaks which are different in maximum value and width between both sides of each attenuating and phase-shifting portion.

Therefore, some embodiments reduce such asymmetry of the reflection peaks between opposite sides of each attenuating and phase-shifting portion of an extreme-UV lithography mask.

Some embodiments may avoid or lessen damage which may be caused to an attenuated phase shift mask by cleaning processes which are applied to the mask. Indeed, the cleaning processes impair the materials of the attenuating and phase-shifting portions, so that the mask lifetime is reduced.

SUMMARY

A first aspect of the present disclosure proposes a mask for extreme-UV lithography, of attenuated phase shift mask type, which has a use face and comprises:

a substrate;

a reflecting structure which is supported by the substrate in the use face, and which is reflection-effective for extreme-UV radiation impinging onto the reflecting structure from a side opposed to the substrate; and attenuating and phase-shifting portions which are distributed within the use face above the reflecting structure, on the side opposed to the substrate, and which are suitable for attenuating and phase-shifting extreme-UV radiation parts reflected by the mask through these portions, when compared to other extreme-UV radiation parts reflected by the mask out of the portions.

Thus, an upper surface of the mask in the use face, which is formed partly by the portions on the side opposed to the substrate, exhibits height variations at sidewalls of the portions which extend perpendicular to the use face. In some embodiments, the mask further comprises a capping layer which covers at least the sidewalls of the portions.

Such capping layer may reduce or suppress the reflection of the extreme-UV radiation on the portion sidewalls which are exposed to incident radiation. In this way, reflection peaks which relate to opposite sides of one attenuating and phase-shifting portion are more symmetrical, with reduced difference in maximum value and peak width.

In addition, the capping layer provides a protection for the materials of the attenuating and phase-shifting portions against corrosion or alteration during the mask cleaning processes. Lifetime of the mask is thus increased.

In some embodiments, the capping layer may further cover top surfaces of the portions, which extend parallel to the use face on the side opposed to the substrate. Improved protection of the attenuating and phase-shifting portions against corrosion or alteration during the mask cleaning processes is provided in this way.

In some embodiments, the capping layer may cover the sidewalls and the top surfaces of the attenuating and phase-shifting portions, and also areas of the reflecting structure between the portions. Such covering may be continuous at edges between the top surfaces and the sidewalls of the portions, and also at bottom limits between the sidewalls of the portions and the areas of the reflecting structure between the portions. Even more efficient protection of the mask materials is thus provided, and such protection remains effective for a large number of repeated mask cleaning processes.

In some embodiments, the capping layer may cover the attenuating and phase-shifting portions and the areas of the reflecting structure between the portions in a conformal manner.

In some embodiments, one or several of the following additional features may be implemented, separately or in combination of several of them:

when the reflecting structure also has at least one sidewall which extends perpendicular to the use face of the mask, the capping layer may further cover the at least one sidewall of the reflecting structure. In this way, at least one of the materials of the reflecting structure which would be exposed at the sidewall of this latter is also protected, in particular against corrosion or alteration caused by the mask cleaning processes;

a thickness of the capping layer may be less than 10 nm, less than 5 nm, or even less than 3 nm;

the capping layer may be comprised of a material which has a n-value for a refractive index effective for the extreme-UV radiation, that is between 0.90 and 1.01, e.g., less than 1.007 or even less than 1.005, when a wavelength of the extreme-UV radiation is 13.5 nm;

the capping layer may be of a ruthenium based, or aluminum based, or silicon nitride based, or titanium nitride based material;

the mask may be intended for extreme-UV radiation having wavelengths of between 12 nm and 15 nm, and the attenuating and phase-shifting portions may be suitable for producing a phase shift equal to $\pi$+/−10% for the extreme-UV radiation parts which are reflected by the mask through the portions, when compared to the other extreme-UV radiation parts which are reflected by the mask out of these portions, for incidence angle of between 2° and 10° for the extreme-UV radiation impinging onto the use face of the mask; and each attenuating and phase-shifting portion may have a thickness less than or equal to 45 nm, measured perpendicular to the use face.

In some embodiments, each attenuating and phase-shifting portion may comprise a single layer portion of a material which is based on tantalum nitride, or based on tantalum oxinitride, or based on tantalum boronoxide, or based on tantalum boronoxinitride.

In some embodiments, each attenuating and phase-shifting portion may comprise a first-layer portion of a transmitting material which is effective for phase-shifting the extreme-UV radiation through transmission, and may further comprise a second-layer portion of an absorbing material which is absorption-effective for the extreme-UV radiation, and which is stacked above the first-layer portion on the side opposed to the substrate. For such embodiments, each first-layer portion may be molybdenum based, and each second-layer portion may be tantalum nitride-, or tantalum oxinitride-, or tantalum boronoxide-, or tantalum boronoxinitride based. For such other embodiments, the thickness of each attenuating and phase-shifting portion may be comprised between 39 nm and 42 nm, measured perpendicular to the use face.

A second aspect of the disclosure proposes a method for manufacturing a mask for extreme-UV lithography, of attenuated phase shift mask type and having a use face, the method comprising the following steps:

providing a substrate supporting a reflecting structure, the reflecting structure being reflection-effective for extreme-UV radiation impinging onto the reflecting structure from a side opposed to the substrate; and forming, above the reflecting structure, attenuating and phase-shifting portions which are suitable for attenuating and phase-shifting extreme-UV radiation parts reflected by the mask through the portions, when compared to other extreme-UV radiation parts reflected by the mask out of these portions.

Thus, the upper surface of the mask, which is formed partly by the portions on the side opposed to the substrate, exhibits height variations at sidewalls of the portions which extend perpendicular to the use face of the mask.

In some embodiments, the method further comprises the following additional step: depositing a capping layer at least on the sidewalls of the portions.

Such method of the second aspect leads to manufacturing an extreme-UV lithography mask which meets the first aspect, including the improvements and embodiments cited above.

In various implementations of the method, the capping layer may be deposited using a low-pressure chemical vapor deposition process, or an atomic layer deposition process.

These and other features will be now described with reference to the appended figures, which relate to non-limiting embodiments.

For clarity sake, element sizes which appear in these figures do not correspond to actual dimensions or dimension ratios.

DETAILED DESCRIPTION

Figure 1A:
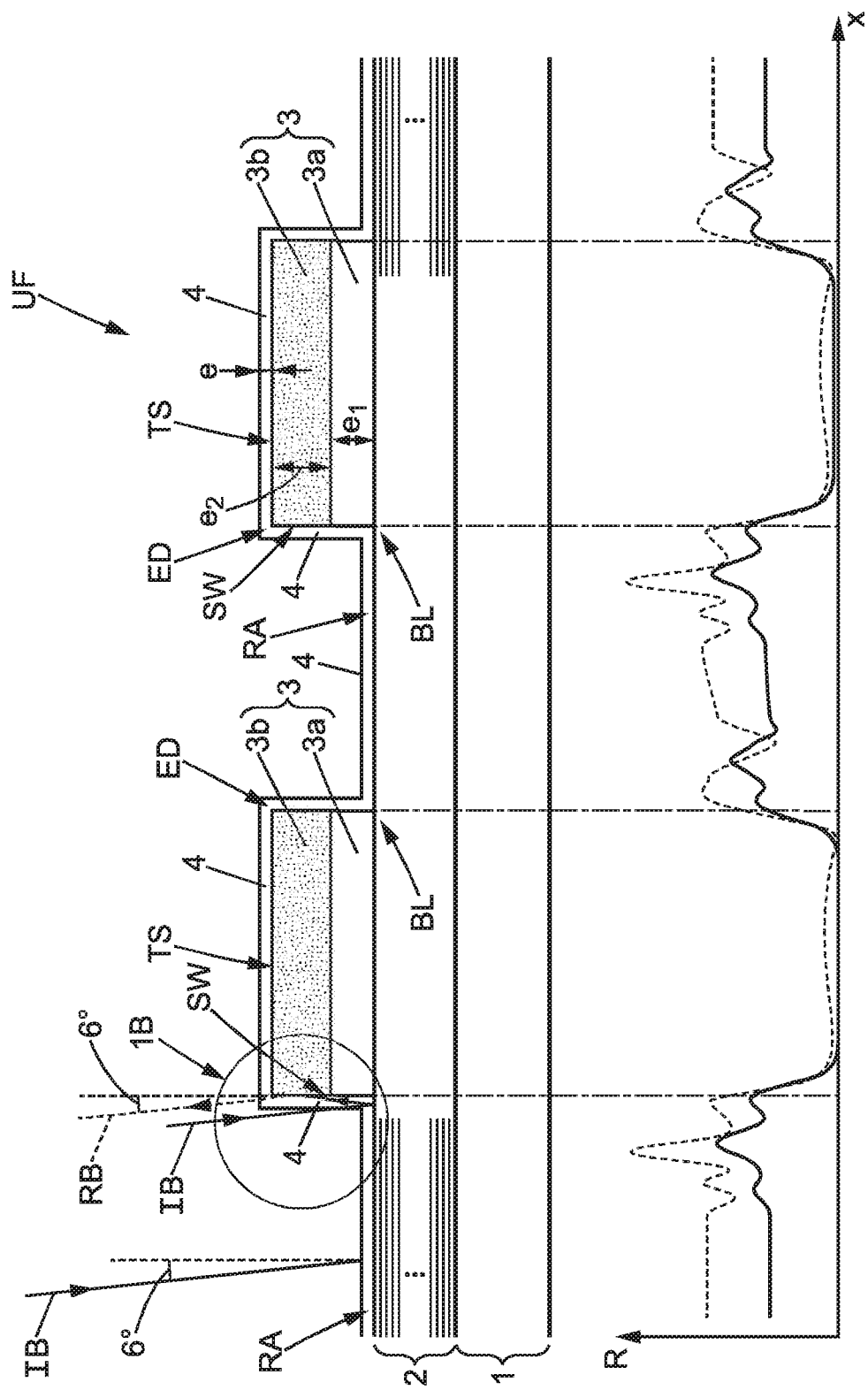
FIG. 1A is a combined illustration, which, in an upper portion, shows a cross-sectional view of an extreme-UV lithography mask and, in a lower portion, shows a reflection diagram as a function of a beam-scanning shift along the mask, according to example embodiments.

According to FIG. 1A, an attenuated phase shift mask comprises a substrate 1, a reflecting structure 2 and attenuating and phase-shifting portions 3.

The substrate 1 may be a material that has a very low value for its thermal expansion coefficient, such as quartz for example.

The reflecting structure 2 defines the use face UF of the mask. In some embodiments, the reflecting structure 2 may be comprised of a stack of a great number of layers alternatively of molybdenum (Mo) and silicon (Si), for example more than forty pairs of molybdenum/silicon layers. Such a reflecting structure effective for extreme-UV radiation may be similar to conventional structures and, further, conventional respective thicknesses of the molybdenum- and silicon layers may also be used. These thicknesses may be selected for enhancing extreme-UV reflection for 13.5 nm-wavelength and 6° incidence angle. Possibly, the reflecting structure 2 may be further provided with a top layer which is used as a stop-layer for an etching process implemented for forming the attenuating and phase-shifting portions 3.

Each attenuating and phase-shifting portion may be comprised of one single layer portion of tantalum nitride (TaN), or tantalum oxinitride, or tantalum boronoxide, or tantalum boronoxinitride. In such case, the thickness of each portion 3 may be 45 nm when measured perpendicular to the use face US of the mask.

Alternatively, as shown in the figures, each attenuating and phase-shifting portion 3 may be comprised of two superposed layer portions: a first-layer portion 3a of an extreme-UV transmitting material and a second-layer portion 3b of an extreme-UV absorbing material. The materials of both layer portions 3a and 3b may be selected for having almost similar refractive index values for a wavelength value concerned, but the material of the first-layer portion 3a has an absorption coefficient value which is much less than that of the second-layer portion 3b. In a known manner, the total thickness of the portions 3 may be selected for producing a phase shift substantially equal to $\pi$ between radiation parts with wavelength of 13.5 nm which are reflected by the reflecting structure 2 through the portions 3 and other radiation parts with same wavelength which are reflected by the reflecting structure 2 out of the portions 3. To this end, when the extreme-UV transmitting material of the first-layer portion 3a is molybdenum (Mo), and the extreme-UV absorbing material of the second-layer portion 3b is tantalum nitride (TaN), the total thickness of each portion 3 may be about 40.5 nm, and the thickness of the tantalum nitride layer 3b may be about 26 nm. These thickness values combine a phase shift value which is substantially equal to $\pi$ for 13.5 nm-wavelength, and an intensity value for the radiation parts reflected through the portions 3, compared to the radiation parts reflected out of the portions 3, which may be optimized for enhancing a contrast of the mask. In FIG. 1A, e1 and e2 denote the respective thicknesses of the layer portions 3a and 3b.

In some embodiments, the attenuated phase shift mask just described is covered by a further layer 4, called capping layer. Although the capping layer 4 may be a conformal layer which continuously covers the attenuating and phase-shifting portions 3, including top surfaces TS and sidewalls SW thereof, a major function of the capping layer 4 relates to the covering of the sidewalls SW of the portions 3. In the present description, the sidewalls SW of the portions 3 are oriented perpendicular to the layers of the reflecting structure 2, and the top surfaces TS of the portions 3 are oriented parallel to the layers of the reflecting structure 2. The sidewalls SW and the top surfaces TS of the portions 3, together with the exposed areas RA of the reflecting structure 2 between the portions 3, form the upper surface of the mask as mentioned in the general part of this description.

Figure 1B:
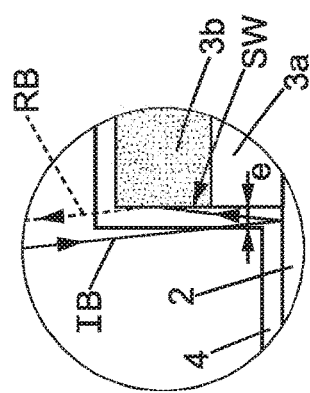
FIG. 1B is an enlargement of a portion of FIG. 1A, according to example embodiments.

The capping layer 4 has the function of reducing the reflection of an extreme-UV beam IB incident on the sidewalls of the attenuating and phase-shifting portions 3, either when the beam IB first reflects on the reflecting structure 2 and then on the sidewall SW of one of the portions 3, or in the reverse order: the beam D3 reflecting first on one portion sidewall SW and then on the reflecting structure 2. The enlarged FIG. 1B illustrates the first case. The reflection angle value which is effective for the reflection on the reflecting structure 2 is about 6°±4° depending on the surface roughness, and the reflection angle value which is effective for the reflection on the sidewall SW of one of the portions 3 is about 84°±4°. With such conditions, it is possible for the capping layer 4 to have a reflection-reducing effect on the sidewalls SW and almost no effect for the reflection on the reflecting structure 2 out of the portions 3. Such reflection reducing effect on the sidewalls SW occurs in a greater extent when the material of the capping layer 4 has a refractive index n-value which is comprised between 0.90 and 1.01 for the radiation wavelength concerned, for example 13.5 nm, and when the capping layer 4 has a thickness of less than 10 nm. Suitable materials for the capping layer 4 in such conditions are ruthenium (Ru), aluminum (Al), silicon nitride (SiN) and titanium nitride (TiN) in a non-limiting manner. In FIGS. 1A and 1B, RB denotes the reflected beam, drawn in broken line for showing its reduced intensity. Then, thanks to the reduction or suppression of the reflection on the portion sidewalls SW which are oriented toward the impinging beam IB with about 6°-incidence value, the beam is reflected with almost similar reflection intensity values R all around each attenuating and phase-shifting portion 3. The diagram in the lower part of FIG. 1A displays the reflection peaks that are produced when the beam IB is moved on the use face UF of the mask in a scanning direction x. The curve drawn with continuous line relates to the attenuated phase shift mask provided with the capping layer 4: it exhibits almost same maximum values on both opposite sides of each portion 3. For comparison, the curve drawn with broken line relates to the attenuated phase shift mask when devoid of the capping layer 4. In this latter case, the reflection peaks for the portion sidewalls SW which are oriented towards the impinging beam IB are much higher than those for the portion sidewalls SW which are oriented opposite the impinging beam IB. This asymmetrical behavior has been strongly reduced or suppressed by implementing the capping layer 4.

Another function of the capping layer 4 is reducing the damage that may be caused to the attenuated phase shift mask by cleaning processes applied to it. For this further function, the capping layer 4 may cover continuously the reliefs and recesses of the use face UF. Put another way, the capping layer 4 may continuously cover the top surfaces TS of the portions 3, the sidewalls SW of these portions 3 and the areas RA of the reflecting structure 2 which are free of portions 3. Additionally, in some embodiments, the capping layer may cover in a conformal manner the edges ED of each portion 3 between its top surface TS and its sidewalls SW, and also the bottom limit BL between each portion sidewall SW and the neighboring area RA of the reflecting structure 2. The materials cited above for the capping layer 4 with respect to the reflection reducing/suppressing function also suit for the protection function.

Processes for depositing the capping layer 4 so that it conforms to the reliefs and recesses of the use face UF of the mask may also be used. In particular, material deposition processes such as low-pressure chemical vapor deposition and atomic layer deposition allow obtaining a conformal and continuous capping layer 4. Depending on the material selected for the capping layer 4, suitable chemical precursors and pressure-temperature deposition conditions can be selected.

Figure 2:
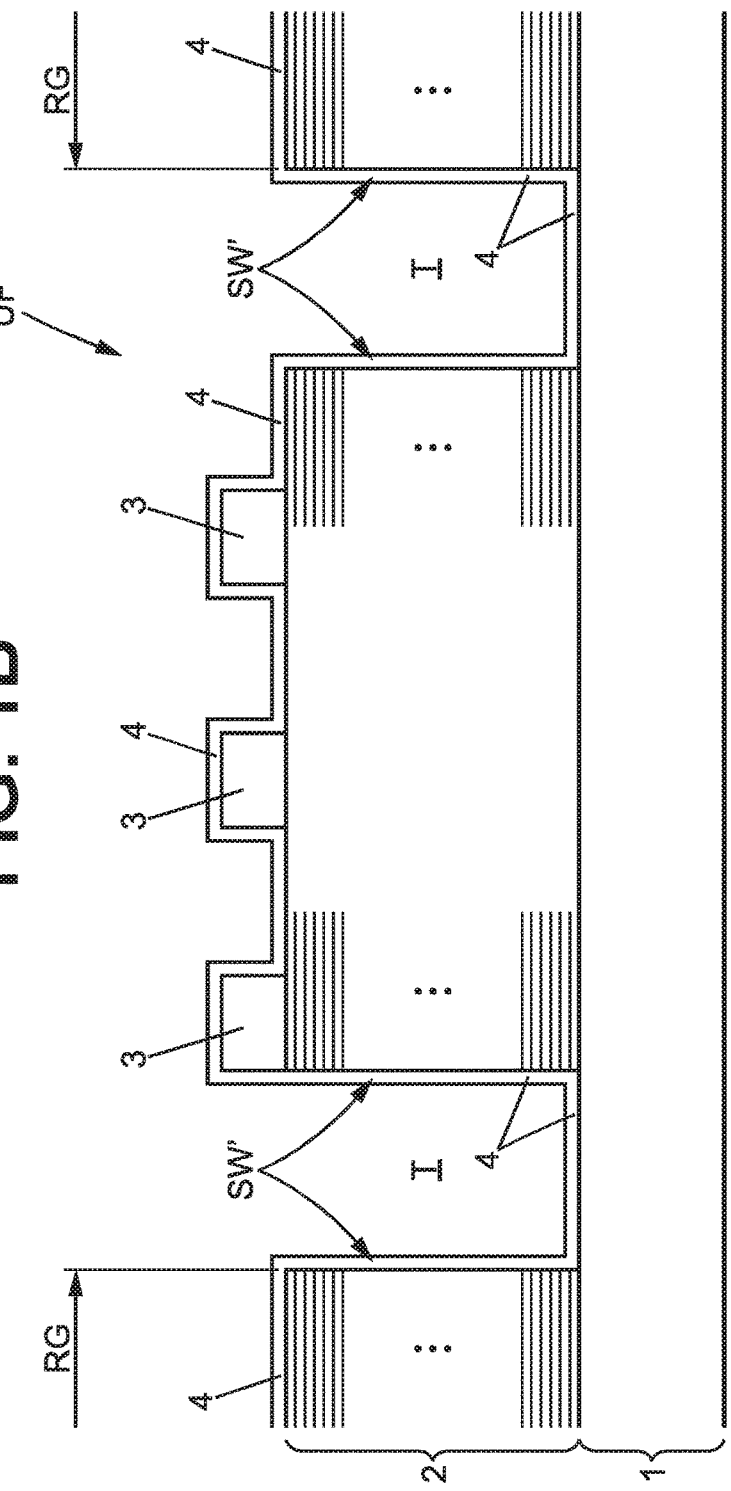
FIG. 2 is a cross-sectional view of another extreme-UV lithography mask, according to example embodiments.

FIG. 2 shows another attenuated phase shift mask, where trenches T have be etched through the reflecting structure 2. Such trenches may extend down to the substrate 1, and may be produced by implementing a suitable etching process. The trenches T may be useful for making real zero reflection of the extreme-UV radiation. In particular, the trenches T form a reflection-black border whereas the reflecting structure 2 in the regions RG form alignment marks. Then, the reflecting structure 2 has a sidewall SW' on each side of each trench T, and silicon- or molybdenum material which would remain exposed at one of the sidewalls SW' may be damaged during cleaning processes implemented for the mask. Therefore, the capping layer 4 may also cover the sidewalls SW' of the reflecting structure 2 in the trenches T. In some embodiments, the capping layer 4 covers the sidewalls SW' and the bottom of the trenches T in a conformal manner.

It is clear that various embodiments may be reproduced while modifying or adapting some of its secondary aspects with respect to the detailed description provided above. In particular, the materials and numeral values cited have been provided for illustrative purposes only.

What is claimed is:

1. A mask for extreme-ultraviolet (extreme-UV) lithography of attenuated phase-shift mask type and having a use face, the mask comprising:
    a substrate;
    a reflecting structure that is supported by the substrate in the use face and is reflection-effective for extreme-UV radiation impinging onto the reflecting structure from a side opposite the substrate, wherein the reflecting structure comprises at least one sidewall that extends perpendicular to the use face of the mask;
    attenuating and phase-shifting portions that are distributed within the use face above the reflecting structure, on the side opposite the substrate, and that are suitable for attenuating and phase-shifting extreme-UV radiation parts reflected by the mask through the portions, when compared to other extreme-UV radiation parts reflected by the mask out of the portions,
    such that an upper surface of the mask on the use face, formed partly by the portions on the side opposite the substrate, exhibits height variations at sidewalls of the portions that extend perpendicular to the use face; and
    a capping layer that covers at least the sidewalls of the portions, and wherein the capping layer covers the at least one sidewall of the reflecting structure.

2. The mask according to claim 1, wherein the capping layer covers top surfaces of the portions, which extend parallel to the use face on the side opposite the substrate.

3. The mask according to claim 2, wherein the capping layer covers areas of the reflecting structure between the portions, continuously at edges between the top surfaces and the sidewalls of the portions and at bottom limits between the sidewalls of the portions and the areas of the reflecting structure between the portions.

4. The mask according to claim 3, wherein the capping layer covers the portions and the areas of the reflecting structure between the portions in a conformal manner.

5. The mask according to claim 1, wherein a thickness of the capping layer is less than 10 nm.

6. The mask according to claim 1, wherein the capping layer comprises a material that has an effective refractive index value for the extreme-UV radiation of between 0.90 and 1.01 when a wavelength of the extreme-UV radiation is 13.5 nm.

7. The mask according to claim 1, wherein the capping layer comprises a material that is ruthenium-based, aluminum-based, silicon nitride-based, or titanium nitride-based.

8. The mask according to claim 1, wherein the mask is intended for extreme-UV radiation having wavelengths of between 12 nm and 15 nm, and wherein the attenuating and phase-shifting portions are suitable for producing a phase shift equal to $\pi+/-10\%$ for the extreme-UV radiation parts that are reflected by the mask through the portions, when compared to the other extreme-UV radiation parts that are reflected by the mask out of the portions, for an incidence angle of between 2° and 10° for the extreme-UV radiation impinging onto the use face of the mask.

9. The mask according to claim 1, wherein each attenuating and phase-shifting portion has a thickness less than or equal to 45 nm, measured perpendicular to the use face.

10. The mask according to claim 1, wherein each attenuating and phase-shifting portion comprises a single-layer portion of a material that is based on tantalum nitride, tantalum oxinitride, tantalum boronoxide, or tantalum boronoxinitride.

11. The mask according to claim 1, wherein each attenuating and phase-shifting portion comprises:
    a first-layer portion of a transmitting material effective for phase-shifting the extreme-UV radiation through transmission; and
    a second-layer portion of an absorbing material that is absorption-effective for the extreme-UV radiation and that is stacked above the first-layer portion on the side opposite the substrate.

12. The mask according to claim 11, wherein each first-layer portion is molybdenum-based and each second-layer portion is tantalum nitride-based, tantalum oxinitride-based, tantalum boronoxide-based, or tantalum boronoxinitride-based, and wherein a thickness of each attenuating and phase-shifting portion between 39 nm and 42 nm, measured perpendicular to the use face.

13. A method for manufacturing a mask for extreme-ultraviolet (extreme-UV) lithography of attenuated phase-shift mask type and having a use face, the method comprising:
    providing a substrate supporting a reflecting structure, the reflecting structure being reflection-effective for extreme-UV radiation impinging onto the reflecting structure from a side opposite the substrate, wherein the reflecting structure has at least one sidewall that extends perpendicular to the use face of the mask;

forming, above the reflecting structure, attenuating and phase-shifting portions that are suitable for attenuating and phase-shifting extreme-UV radiation parts reflected by the mask through the portions, when compared to other extreme-UV radiation parts reflected by the mask out of the portions, such that an upper surface of the mask, formed partly by the portions on the side opposite the substrate, exhibits height variations at sidewalls of the portions that extend perpendicular to the use face of the mask; and depositing a capping layer at least on the sidewalls of the portions, wherein the capping layer covers the at least one sidewall on the reflecting structure.

14. The method according to claim 13, wherein a thickness of the capping layer is less than 10 nm.

15. The method according to claim 13, wherein the capping layer comprises a material that has an effective refractive index value for the extreme-UV radiation of between 0.90 and 1.01 when a wavelength of the extreme-UV radiation is 13.5 nm.

16. The method according to claim 13, wherein the capping layer comprises a material that is ruthenium-based, aluminum-based, silicon nitride-based, or titanium nitride-based.

* * * * *